[19] United States Patent
Goetting et al.

[11] Patent Number: 5,694,047
[45] Date of Patent: Dec. 2, 1997

[54] METHOD AND SYSTEM FOR MEASURING ANTIFUSE RESISTANCE

[75] Inventors: F. Erich Goetting, Cupertino; Venu Kondapalli; David P. Schultz, both of San Jose, all of Calif.

[73] Assignee: Xilinx, Inc., San Jose, Calif.

[21] Appl. No.: 512,795

[22] Filed: Aug. 9, 1995

[51] Int. Cl.$^6$ .............. G01R 27/08; G11C 17/16
[52] U.S. Cl. .............. 324/705; 324/691; 324/550; 324/713; 365/96; 257/530; 326/38
[58] Field of Search .............. 324/691, 705, 324/713, 714, 549, 550, 601; 365/96; 257/50, 530; 326/38; 327/525; 437/922

[56] References Cited

U.S. PATENT DOCUMENTS

| | | | |
|---|---|---|---|
| 5,291,079 | 3/1994 | Goetting | 307/465 |
| 5,293,133 | 3/1994 | Birkner et al. | 324/713 |
| 5,367,207 | 11/1994 | Goetting et al. | 327/525 X |
| 5,414,365 | 5/1995 | McCollum | 324/550 |
| 5,418,738 | 5/1995 | Abadeer et al. | 257/50 X |
| 5,453,696 | 9/1995 | Becker et al. | 324/550 |
| 5,469,396 | 11/1995 | Eltoukhy | 365/210 |
| 5,502,395 | 3/1996 | Allen | 324/713 |
| 5,525,909 | 6/1996 | McCollum | 324/550 |
| 5,526,312 | 6/1996 | Eltoukhy | 365/96 |
| 5,572,476 | 11/1996 | Eltoukhy | 365/210 |
| 5,631,862 | 5/1997 | Cutter et al. | 365/96 |
| 5,635,854 | 6/1997 | Shimanek et al. | 326/38 |

*Primary Examiner*—Glenn W. Brown
*Attorney, Agent, or Firm*—Adam H. Tachner; Edel M. Young

[57] ABSTRACT

A method and system for measuring programmed antifuse resistance in an FPGA without disturbing the antifuse resistance. The method includes estimating a plurality of subparts of the programming path connecting low and high programming voltage sources on the FPGA device, measuring the path as a whole, and subtracting the sum total of the subparts from the whole path measurement, thereby deriving the antifuse resistance. If the derived antifuse resistance is higher than desired, programming and measurement may be repeated to ensure device longevity and accurate timing for implemented designs.

18 Claims, 5 Drawing Sheets

METHOD AND SYSTEM FOR MEASURING ANTIFUSE RESISTANCE

BACKGROUND OF THE INVENTION

1. Field of the Invention

The invention relates to programmable logic devices formed in integrated circuit semiconductor chips. More particularly, the invention relates to analyzing, programming, and verifying the resistance across interconnects of an antifuse-based programmable logic device.

2. Description of the Related Art

Programmable devices are currently available in several different architectures. One type, Field-Programmable Gate Arrays (FPGAs—sometimes referred to as programmable ASICs), comprise an array of programmable logic cells which can be interconnected by programmable interconnect lines to generate complex logic functions. In an FPGA device, it is possible to feed the output of any one logic cell to an input of any other logic cell, and thereby form a chain, generating a function which has multiple levels of logic.

A major point of distinction between FPGAs is the re-programmability of the interconnect structure. The structure and content of the interconnect in an FPGA is called its routing architecture. The routing architecture consists of both wire segments and programmable switches. Programmable switches are constructed using several techniques, including: reprogrammable pass-transistors controlled by static RAM cells, antifuses, EPROM transistors, and EEPROM transistors. The preferred embodiment of the present invention is directed at antifuse-based FPGA architectures.

Antifuse Programming Technology

Antifuse programming technology is used by a number of FPGA manufacturers. An antifuse normally resides in a high impedance state but can be "fused" into a low-impedance state when programmed by placing a high voltage difference across the terminals, thereby forming an interconnect or via between conducting channels. Once fused, an antifuse cannot be forced back to its high impedance state. However, while a programmed antifuse does have a long fused lifespan, a number of factors such as use current and antifuse architecture contribute to antifuse failures (impedance increases) during the life of an FPGA.

One possible way to construct an antifuse is to form an amorphous silicon layer between two metal conductors. FIG. 1 illustrates a cross-sectional view of such an antifuse. Amorphous antifuse 20 comprises an insulating layer sandwiched between metal wires 23 and 25 so that a first surface portion 26 of the antifuse contacts first wire 23 and so that a second surface portion 27 of the antifuse contacts second wire 25. In its unprogrammed state, first wire 23 is insulated from second wire 25 by antifuse insulating layer 28. In its programmed state, a conductive path 29 is formed through antifuse insulating layer 28 so that first wire 23 and second wire 25 are in electrical communication, coupled by a substantially decreased resistance.

Accurate determination of FPGA antifuse resistance is important for two reasons. First, resistance across interconnects affects the performance of circuits connected by the interconnects. If resistance across one or more antifuses differs significantly from the resistance anticipated by FPGA timing analysis software, the circuit interconnects or layout configured into a device may not function properly.

FIG. 2 illustrates a second important use for accurate antifuse resistance information. Over time, antifuses programmed to a higher resistance tend to fail more quickly than low resistance programmed antifuses. As shown, the resistance of a programmed antifuse directly affects the mean number of switching cycles which an antifuse can be expected to support during its lifetime. The reliability curve of FIG. 2 is representative of longevity expectations for some antifuse technologies. Thus, the longevity and efficacy of antifuse-based devices is directly linked to the antifuse resistance obtained after programming interconnections between logic cells. To guarantee long term accuracy of antifuse-based FPGAs, the resistance across any particular antifuse must be known and, if possible, verified to be below targeted resistance limits.

There is, therefore, a need among all antifuse-based architectures for a reliable and fast method of verifying the resistance of programmed interconnect. If antifuse resistance increases after programming, accessing and replacing the device after distribution and use can be slow and expensive. It is therefore preferable to ensure antifuse longevity and accurate timing just after programming, using the same hardware and software with which the interconnect was programmed. The present invention provides a high speed, easy to use method of analyzing, programming, and verifying the resistance across interconnects of an antifuse-based programmable logic device.

Available Approaches to Antifuse Resistance Measurement

One available approach to verification of one-time programmable FPGAs is the use of a transistor placed in parallel with a selected number of antifuses, as disclosed in U.S. Pat. No. 5,293,133 to Birkner, et al., incorporated herein in its entirety by reference. The parallel element method comprises a series of three measurements made both before and after programming of an antifuse, wherein a transistor placed in parallel with the antifuse is activated and deactivated in successive tests. Each of the three tests is modeled as an equation including three variables. The three tests therefore result in a solvable three equation system including three variables. However, the parallel element method suffers from a number of shortcomings.

A first disadvantage of the available method is the need to program (drastically reduce antifuse resistance) the antifuse during the resistance measurement process in order to measure the post-programming antifuse resistance. Thus, the available method fails to accommodate the user who might wish to verify programmed antifuse resistance without altering antifuse resistance in the process. Moreover, requiring mid-measurement programming eliminates the possibility of taking the measurement long after the device is programmed to verify antifuse resistivity estimates, thereby enabling later measurements of device longevity.

Another disadvantage of the available method is the need to include in the interconnect structure a transistor or other conducting element dedicated to resistance measurement. Such elements consume valuable silicon space and add an additional element of uncertainty to the reliability of a resistance reading.

A still further disadvantage of the available method is the impractical nature of performing the parallel element test on every antifuse of an interconnect structure. In a device with hundreds of thousands of antifuses, space limitations make the inclusion of a special transistor in parallel with every antifuse unrealistic. Thus, the device programmer (normally programming software which runs on a computer workstation) determining device layout, is forced to assume that a reading from a particular antifuse or a group of presumably representative antifuses reflects the resistance of many antifuses without a parallel conducting test element.

Yet another disadvantage with the prior art method is the need to store pre-programming measurements if one wishes to verify antifuse resistance readings in the distant future. Because such readings are chip-specific, valuable space on the chip would be occupied with the pre-programming baseline information to preserve the option for future verification.

SUMMARY OF THE INVENTION

Given the relationship between antifuse-based device longevity and timing and programmed antifuse resistance, there is a need for a method of measuring antifuse resistance which is thorough, fast, and easy to implement or, preferably, is automatically implemented in available programming software. To satisfy this need, the method of the preferred embodiment of the present invention comprises the steps of determining a total resistance for a programming path, determining a parasitic resistance across interconnect wires, determining an element resistance across a switchable element, and subtracting the element resistance and the parasitic resistance from the total resistance to derive the resistance of the antifuse.

DETAILED DESCRIPTION OF THE PREFERRED EMBODIMENT

Figure 4:
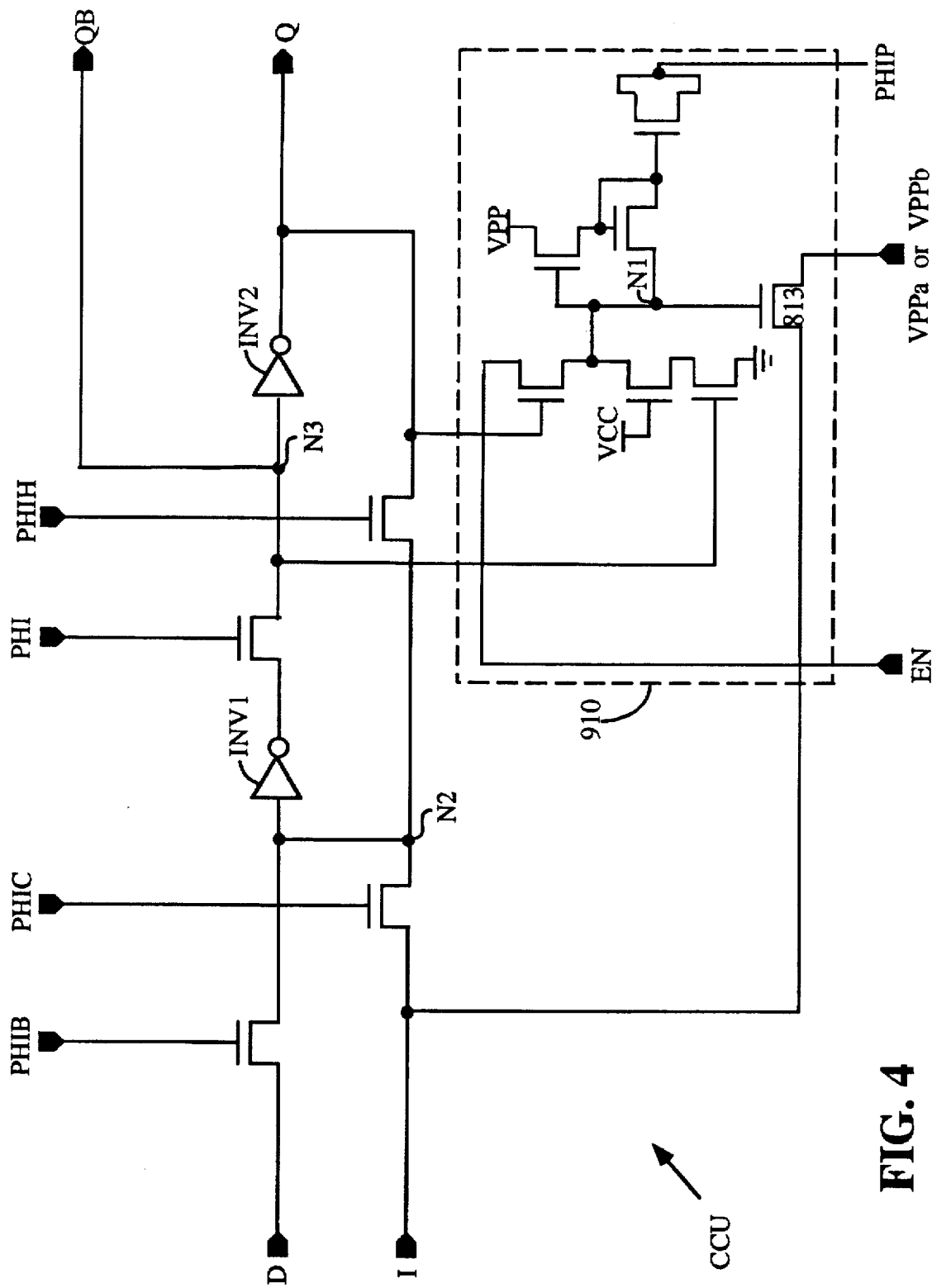
FIG. 4 shows an implementation of a configuration control unit used in the preferred embodiment of the method of the present invention.

The present invention provides a method and apparatus for quickly and thoroughly analyzing, adjusting and verifying the resistance of implemented logic cell interconnections, preferably in the context of an antifuse-based architecture. A preferred embodiment of the present invention exploits characteristics of a configuration control unit, or CCU, as shown in FIG. 4 and described in U.S. Pat. No. 5,291,079 which is incorporated herein in its entirety by reference, although other antifuse architectures could be incorporated into the method of the present invention.

Programming antifuses

Configuration or programming of an FPGA entails configuration of logic cells to perform a desired function and programming of the interconnect structure to interconnect the cells to each other as desired. This structure is interconnected by programming (making conductive) selected antifuses to connect selected interconnect lines.

Figure 1:
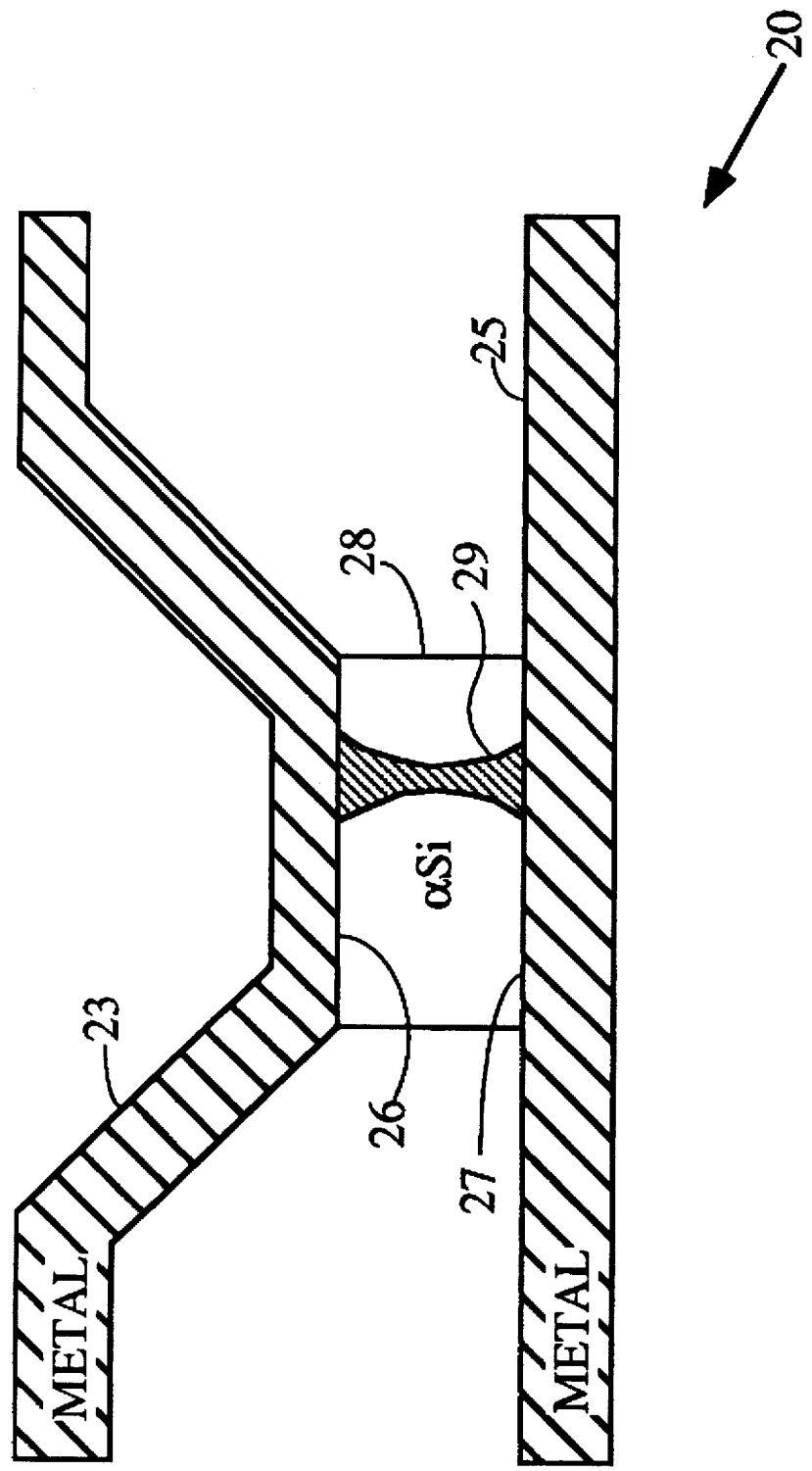
FIG. 1 shows an antifuse on which a preferred method of practicing the present invention might be performed.
Figure 2:
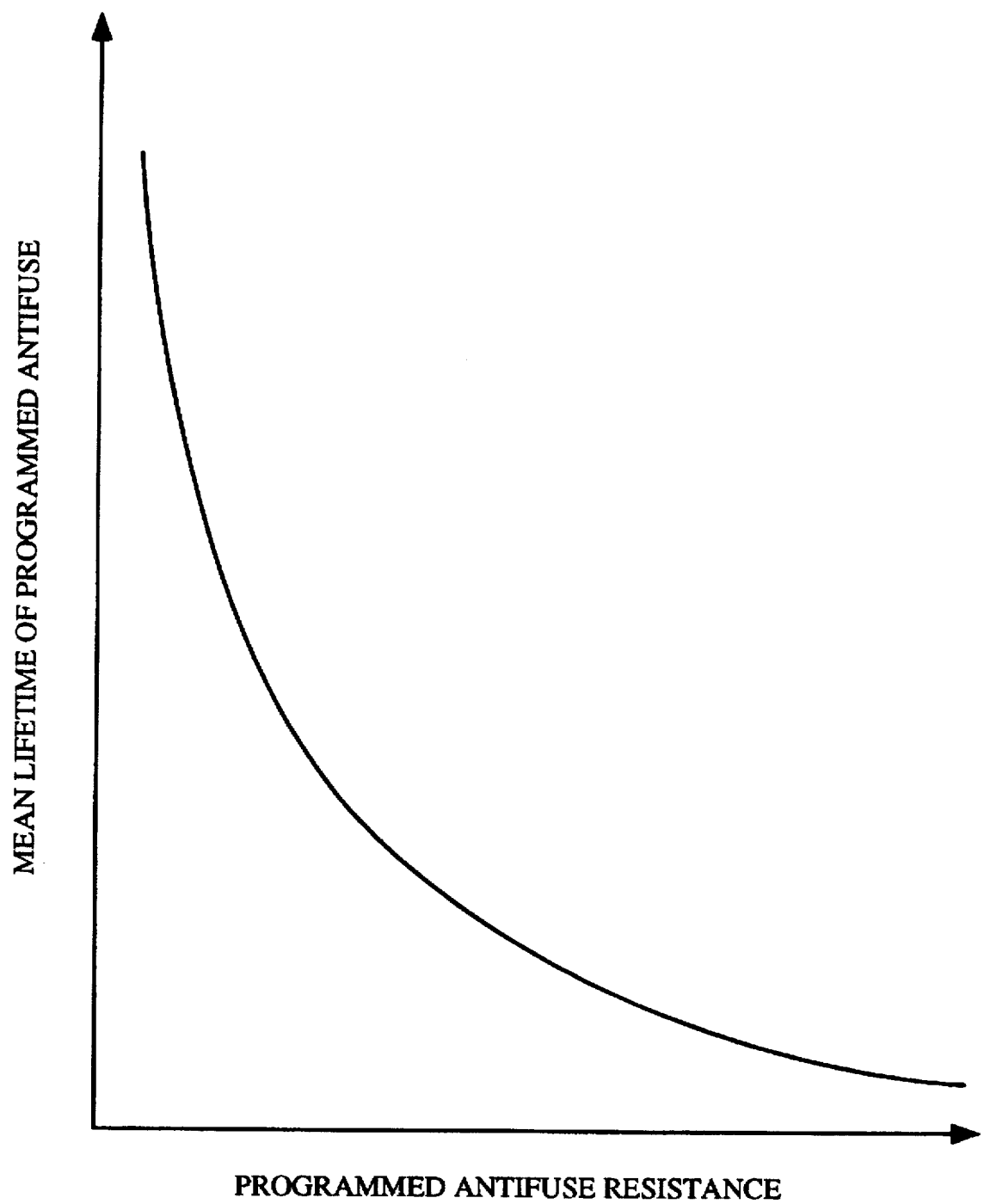
FIG. 2 is a graph showing a generalized representation of programmed antifuse resistance versus mean lifetime in cycles of a programmed antifuse.
Figure 3:
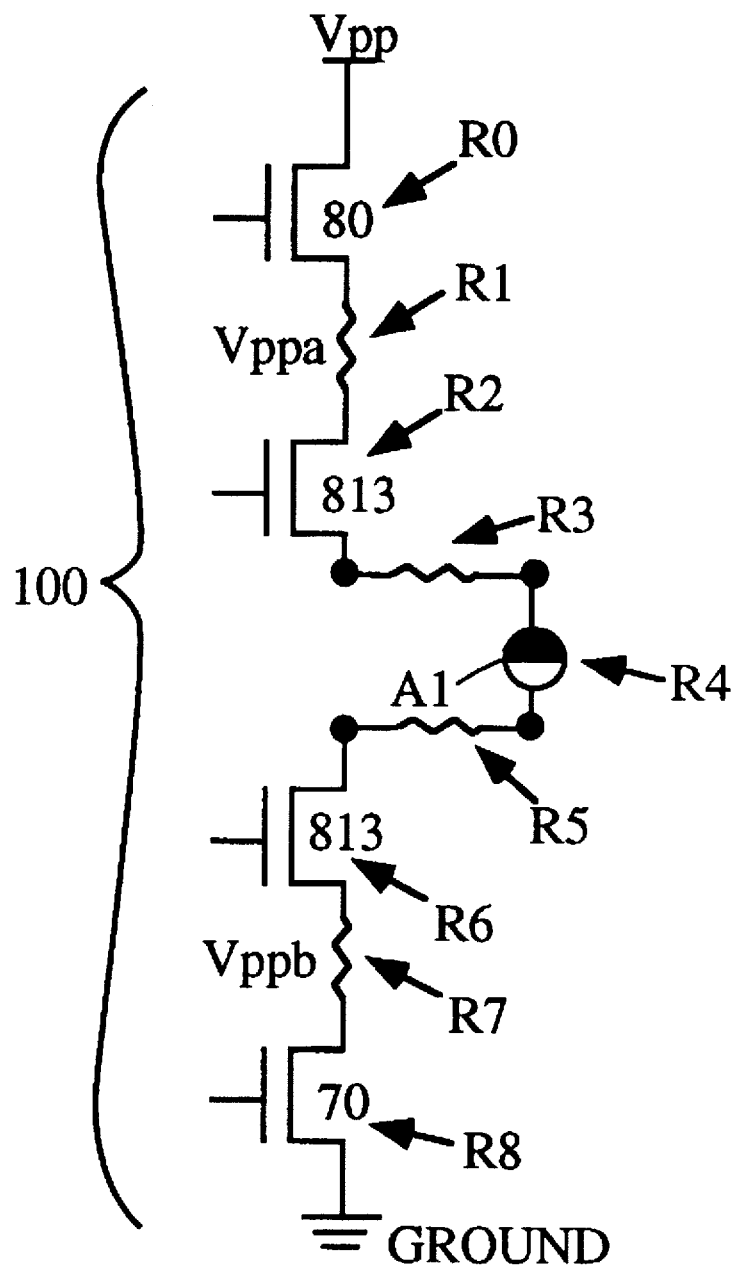
FIG. 3 provides an electronic circuit representation of an antifuse programming structure and path.

An antifuse is programmed by applying two sufficiently different programming voltages to two metal lines at top and bottom antifuse terminals 23 and 25 in FIG. 1. FIG. 3 shows a simplified representation of the antifuse programming path created incorporating the CCU shown in FIG. 4. In an FPGA including CCUs, when two different CCUs apply sufficiently different values of VPP (such as VPPa and VPPb shown in FIG. 3) to their respective interconnect lines I, the voltage difference applied across an antifuse in the interconnect structure is sufficient to program the antifuse. That voltage difference, for example 10 volts, is sufficient to program antifuse A1 in FIG. 3. The above-described process of applying the programming voltage difference is repeated for every antifuse needed in a layout to interconnect logic cells.

CCU-based Antifuse Programming

In one type of antifuse-based FPGA architecture, every antifuse is connected to two configuration control units (CCU), an example of which is shown in FIG. 4. The two terminals of an antifuse are connected to separate CCUs. The CCUs control the programming of the antifuse and include the transistors used to program the antifuse. While most antifuse-based FPGA architectures do not include CCUs for antifuse programming, any antifuse programming path can be expected to include a programming transistor element connected to each antifuse. The present invention is therefore compatible with other available or envisioned antifuse-based FPGA architectures.

Measuring Antifuse Resistance

After programming, the antifuse resistance must be measured and verified to ensure device longevity and timing accuracy. The method of the present invention includes measuring the total resistance across a conductive path 100 from VPP to ground, across grid transistors 70 and 80, programming transistors 813 and antifuse A1, as illustrated in FIG. 3. The nine basic resistance subunits comprising the total resistance across conductive path 100 are more clearly illustrated in FIG. 5. Typically, the total resistance across conductive path 100 is in the range of 400 to 800 Ohms. Once the total resistance is known and all subparts of that resistance except the antifuse resistance are estimated, the antifuse resistance can be determined by calculating the difference between the measured total resistance of the path and the calculated total resistance of the subparts of the path. The following will summarize the estimation techniques for each of the determinable resistance subparts. The disclosed method steps involve both measurement techniques and calculations derived from the measurements.

Figure 5:
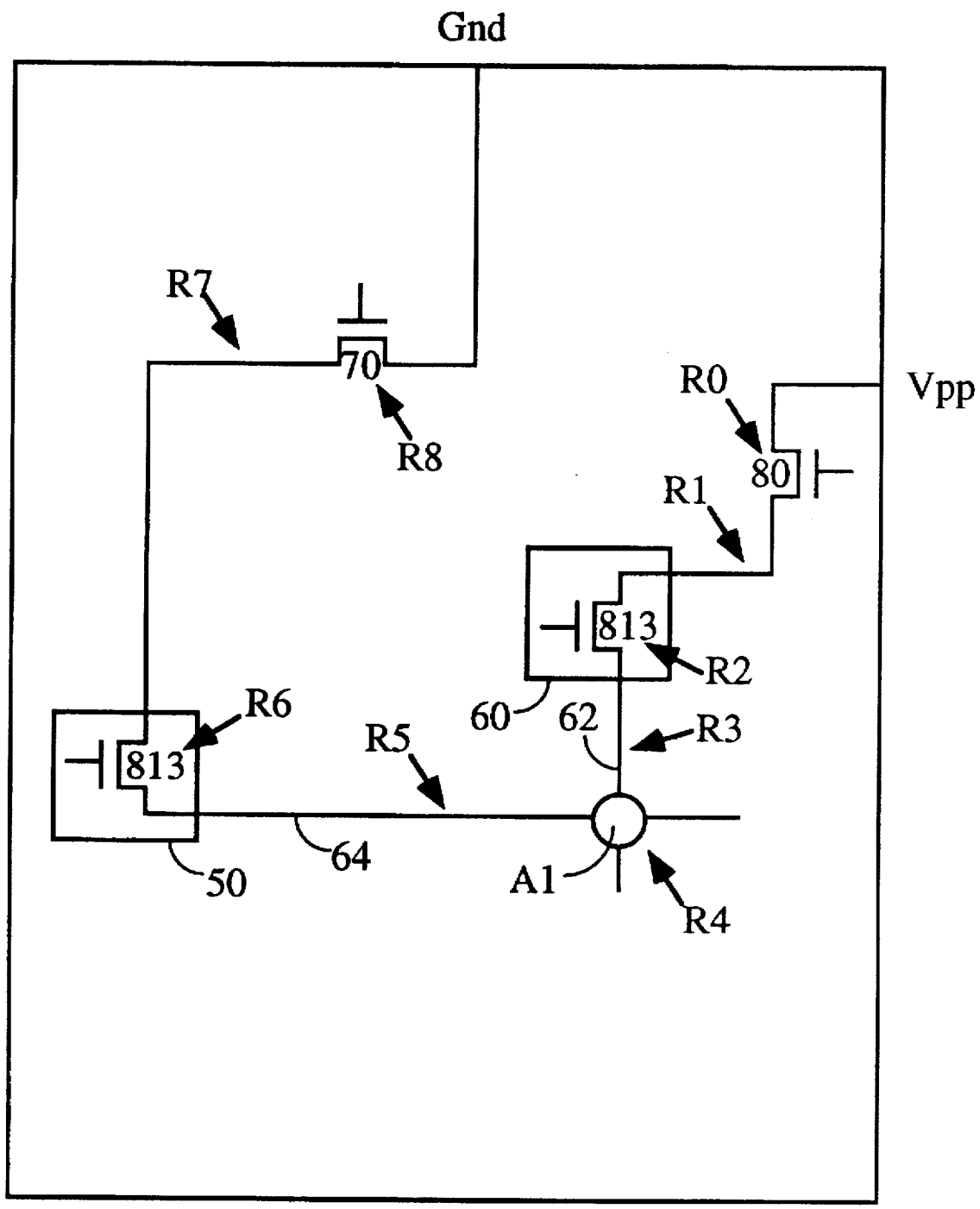
FIG. 5 illustrates the resistance subparts which vary with programmed layout and combine to perform the total resistance along the antifuse programming path shown in FIG. 3.

Referring to FIG. 5, the nine resistance subparts are as follows. R0 and R8 represent the resistance across grid transistors 80 and 70, respectively, leading to grid supply voltages VPPa and VPPb shown in FIG. 3. These transistors are separated from voltage sources VPP and ground by negligible wire lengths, and hence the segments between transistors 70 and 80 and Gnd and Vpp respectively have negligible resistance. R1 and R7 represent the resistance across wire segments connecting the grid transistors to the programming transistors 813. R2 and R6 represent the resistances across the programming transistors 813.

R3 represents the parasitic resistance along the portion of wire segment 62 connecting antifuse A1 to programming transistor 813 of CCU 60. For any particular circuit layout, the length of wire segment 62 is known to the programmer from the layout data. The parasitic resistance per unit length R/L of any metal type on the device is derived by measuring the current induced along a known length of wire by a known voltage. In the preferred embodiment of the present invention, R3 is calculated by multiplying the resistance per unit length R/L by the known wire length L of the wire segment. R5 is similarly derived for the segment 64 connecting transistor 813 of CCU 50 to antifuse A1. The measurements necessary to derive resistances R3 and R5 are therefore easily calculated for the device under analysis.

Resistance R1 represents the parasitic metal wire resistance from grid transistor 80 to programming transistor 813 of CCU 60. R7 similarly represents the metal wire resistance from grid transistor 70 to the programming transistor 813 of CCU 50. Both resistances R1 and R7 can be determined via the method used for deriving R3 and R5, namely, calculating the length of wire utilized and multiplying that length by the resistance per unit length R/L of the metal type in use.

The last four component measurements of total resistance path 100 needed to derive the resistance R4 across antifuse A1 are transistor resistances R0, R2, R6 and R8. In a preferred antifuse device, all programming CCUs share the same layout including programming transistor 813 shown in FIG. 4. Moreover, the programming transistor 813 architecture in every CCU is identical. Similarly, all grid transistors 70 and 80 share identical structure. Thus, once the linear, conducting resistance R2 across transistor 813 is determined for any CCU on a device, the resistance across all programming transistors on the device will be known as well. And once the linear resistance R0 across any grid transistor 80 is known that data can be generalized for all grid transistors.

At least one of each type of transistor in the antifuse programming path is placed at a predetermined address for the programmer to determine the resistance across the transistors. In a preferred embodiment of the present invention, a single measurement path is created wherein two grid transistors and two programming transistors are placed in series and interconnected by extremely short lines of negligible resistance. Thus, with a single measurement the total resistance of these four path subparts is known for every interconnect antifuse on the device.

Thus, eight of the nine resistance components comprising the total resistance Rttl along path 100 are derived. The total for those eight elements might be, for instance, 700 ohms. After programming antifuse A1, the total resistance Rttl is measured by placing a small voltage difference between VPP and ground and measuring the current along resistance path 100. Equally useful would be to induce a known current to flow along the resistance path and measure the voltage difference between VPP and ground. R4 is then found by solving the following equation:

$$R4=Rttl-[(L1*r1/L)+(L3*r3/L)+(L5*r5/L)+(L7*r7/L)+(R0+R8+R2+R6)]$$

wherein L1 through L7 represent the lengths of the metal wire segments in the programming path, R1/L through R5/L represent the resistance per unit length of the segments, and (R0+R8+R2+R6) represents the total transistor resistance along the programming path.

Once the total resistance Rttl is measured, the estimated subpart measurements can be subtracted from the total to derive resistance R4 of antifuse A1. If the calculated value of resistance R4 is large enough to substantially reduce the projected longevity of a device or compromise layout timing, then the programming process can be repeated or the device discarded.

While the present invention has been described with reference to certain preferred embodiments, those skilled in the art will recognize that various modifications and other embodiments may be provided. These other embodiments are intended to fall within the scope of the present invention. These and other variations upon and modifications to the embodiment described herein are provided for by the present invention which is limited only by the following claims.

What is claimed is:

1. A method of determining the resistance of an antifuse of a programmable device, wherein the antifuse is situated within a programming path including a switchable element and interconnecting wires, said method being substantially executable within said programming path, said method comprising the steps of:

(a) determining a total resistance for said programming path;

(b) determining a parasitic resistance across said wires, said wires being in electrical communication with said antifuse;

(c) determining an element resistance across said switchable element, said switchable element being in electrical communication with said antifuse;

(d) subtracting said element resistance and said parasitic resistance from said total resistance to derive the resistance of said antifuse.

2. The method of claim 1, wherein step (a) includes inducing a voltage difference across said programming path and measuring an induced current across said path.

3. The method of claim 1, wherein step (b) includes recording the length of said wires, deriving the parasitic resistance of a known length of wire, and determining said parasitic resistance across said wires therefrom.

4. The method of claim 1, wherein step (c) includes applying a voltage across said switchable element and measuring an induced current across said switchable element.

5. The method of claim 1, wherein said switchable element is an antifuse programming transistor.

6. The method of claim 1, further comprising programming said antifuse to lower said derived antifuse resistance.

7. A method of determining an electrical characteristic of an antifuse of a programmable device after the antifuse is at least partially programmed, said method comprising the steps of:

(a) providing an at least partially programmed antifuse, (b) determining an electrical characteristic of a first conductive path in electrical communication with said antifuse;

(c) determining an electrical characteristic of a first conductive element in electrical communication with said antifuse;

(d) determining an electrical characteristic of a second conductive path in electrical communication with said antifuse;

(e) determining said electrical characteristic of said antifuse based at least in part on said electrical characteristics determined in steps b, c and d.

8. The method of claim 7, wherein said first conductive path comprises a path from a source voltage to said first conductive element.

9. The method of claim 7, wherein said conductive element comprises a programming transistor.

10. The method of claim 7, wherein said second conductive path comprises a path from said conductive element to said antifuse.

11. The method of claim 7, wherein step (e) includes subtracting the values of said electrical characteristics from a value of a general electrical characteristic for a circuit comprising both of said conductive paths and said conductive element, and deriving said electrical characteristic of said antifuse as a remainder from said subtracting step.

12. The method of claim 7, wherein said electrical characteristics comprises resistance.

13. A system for determining the resistance of an antifuse of a programmable device, wherein the antifuse is situated along a programming path including a switchable element and interconnecting wires, said system capable of providing said determination in a manner substantially independent of any other than said programming path comprising:

(a) means for determining a total resistance for said programming path;

(b) means for determining a parasitic resistance across said wires, said wires being in electrical communication with said antifuse;

(c) means for determining an element resistance across said switchable element, said switchable element being in electrical communication with said antifuse;

(d) means for subtracting said element resistance and said parasitic resistance from said total resistance to derive the resistance of said antifuse.

14. The system of claim 13, wherein (a) includes means for inducing a voltage difference across said programming path and means for measuring an induced current across said path.

15. The system of claim 13, wherein (b) includes means for recording the length of said wires, means for deriving the parasitic resistance of a known length of wire, and means for determining said parasitic resistance across said wires therefrom.

16. The system of claim 13, wherein (c) includes means for applying a voltage across said switchable element and measuring an induced current across said switchable element.

17. The system of claim 13, wherein said switchable element is an antifuse programming transistor.

18. The system of claim 13, further comprising means for programming said antifuse to lower said derived antifuse resistance.

\* \* \* \* \*

UNITED STATES PATENT AND TRADEMARK OFFICE
CERTIFICATE OF CORRECTION

| | | |
|---|---|---|
| PATENT NO. | : | 5,694,047 |
| DATED | : | Dec. 2, 1997 |
| INVENTOR(S) | : | F. Erich Goetting, Venu Kondapalli, David P. Schultz |

It is certified that error appears in the above-identified patent and that said Letters Patent is hereby corrected as shown below:

On the title page, under the section titled "References Cited, U.S. Patent Documents" delete "5,414,365" and insert --5,414,364--

Signed and Sealed this

Second Day of February, 1999

Attest:

*Attesting Officer*

*Acting Commissioner of Patents and Trademarks*